(12) United States Patent
Han et al.

(10) Patent No.: US 6,986,974 B2
(45) Date of Patent: Jan. 17, 2006

(54) ATTENUATED PHASE SHIFT MASK FOR EXTREME ULTRAVIOLET LITHOGRAPHY AND METHOD THEREFORE

(75) Inventors: Sang-In Han, Phoenix, AZ (US); Scott D. Hector, Austin, TX (US); Pawitter Mangat, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 172 days.

(21) Appl. No.: 10/688,589

(22) Filed: Oct. 16, 2003

(65) Prior Publication Data

US 2005/0084768 A1    Apr. 21, 2005

(51) Int. Cl.
    *G01F 9/00*    (2006.01)
(52) U.S. Cl. .......................................... 430/5
(58) Field of Classification Search ................ 430/5, 430/322–324, 311; 716/19–21
    See application file for complete search history.

(56) References Cited

U.S. PATENT DOCUMENTS

| | | | |
|---|---|---|---|
| 5,052,033 A | 9/1991 | Ikeda et al. | |
| 5,521,031 A * | 5/1996 | Tennant et al. | 430/5 |
| 5,641,593 A | 6/1997 | Watanabe et al. | |
| 5,939,227 A | 8/1999 | Smith | |
| 6,392,792 B1 | 5/2002 | Naulleau | |
| 6,641,959 B2 | 11/2003 | Yan | |
| 6,645,679 B1 * | 11/2003 | La Fontaine et al. | 430/5 |
| 6,653,053 B2 * | 11/2003 | Mangat et al. | 430/311 |
| 2001/0051304 A1 | 12/2001 | Stivers et al. | |
| 2002/0192571 A1 | 12/2002 | Schwarzl | |
| 2003/0039894 A1 | 2/2003 | Yan et al. | |

OTHER PUBLICATIONS

H.L. Chen and L.A. Wang, "Simulation on a New Reflection Type Attenuated Phase Shifting Mask for Extreme Ultraviolet Lithography", Institute of Electro-Optical Engineering National Taiwan University, Taipei, Taiwan, R.O.C.; Part of the SPIE Conference on Emerging Lithographic Technologies III, Santa Clara, California, Mar. 1999, SPIE vol. 3676, 0277-786X/99.

Pawitter Mangat, Scott Hector, Stewart Rose, Greg Cardinale, Edita Tejnil, Alan Stivers, "EUV Mask Fabrication With Cr Absorber", Motorola, Inc., Advanced Products Research and Development Laboratory, Austin TX, Sandia National Laboratories, Livermore, CA, Intel Corporation, Santa Clara, CA; In Emerging Lithographic Technologies IV, Elizabeth A. Dobisz, Editor, Proceedings of SPIE vol. 3997 (2000), 0277-786X/00.

(Continued)

*Primary Examiner*—S. Rosasco
(74) *Attorney, Agent, or Firm*—Ingrassia Fisher & Lorenz, P.C.

(57) ABSTRACT

Methods and apparatus are provided for extreme ultraviolet phase shift masks. The apparatus comprises a substrate, a reflectance region, and an attenuating phase shifter. The reflectance region overlies the substrate. The attenuating phase shifter overlies the reflectance region. The attenuating phase shifter includes a plurality of openings that expose portions of the reflectance region. The attenuating phase shifter attenuates radiation through a combination of absorption and destructive interference. The method comprises projecting radiation having a wavelength less than 40 nanometers towards a mask having a plurality of openings through an attenuating phase shifter. The plurality of openings expose a reflectance region in the mask. The attenuating phase shifter is less than 700 angstroms thick. Radiation impinging on the reflectance region exposed by said plurality of openings is reflected whereas radiation impinging on the attenuating phase shifter is attenuated and shifted in phase. The attenuating phase shifter attenuates using absorption and destructive interference.

29 Claims, 6 Drawing Sheets

OTHER PUBLICATIONS

Stephen P. Vernon, Patrick A. Kearney, William M. Tong, Shon Prisbrey, Cindy Larson, Craig E. Moore, Frank W. Weber, Greg Cardinale, Pei-Yang Yan, Scott D. Hector, "Masks for Extreme Ultraviolet Lithography", Lawrence Livermore National Laboratory, Livermore, CA, Sandia National Laboratories, Livermore, CA, Intel Corporation, Santa Clara, CA, Motorola, Inc., Austin, TX; Part of the BACUS Symposium on Photomask Technology and Management, Redwood City, CA, Sep. 1998, SPIE vol. 3546, 0277-786X/98.

Cho et al, "Fabrication of Attenuated Phase Shift Mask for EUV Lithography", Dept. of Electrical Engineering & Computer Science, Berkeley, CA, 14 pages.

Wood et al, "Use of Attenuated Phase Masks in Extreme Ultraviolet Lithography", American Vacuum Society, J. Vac. Sci. Technol. B 15(6), Nov./Dec. 1997, pp. 2448-2451.

Chen et al, "Simulation on a New Reflection Type Attenuated Phase Shifting Mask for Extreme Ultraviolet Lithography", Part of the SPIE Conference on Emerging Lithographic Technologies III, SPIE vol. 3676, Mar. 99, pp. 578-586.

Mangat et al., "EUV Mask Fabrication with Cr Absorber", Reprinted from Emerging Lithographic Technologies IV, Proceedings of SPIE, vol. 3997 (2000), pp. 76-82.

Vernon et al., "Masks for Extreme Ultraviolet Lithography", part of the BACUS Symposium on Photomask Technology & Management, SPIE vol. 3546, Sep. 1998, pp. 184-193.

* cited by examiner

ATTENUATED PHASE SHIFT MASK FOR EXTREME ULTRAVIOLET LITHOGRAPHY AND METHOD THEREFORE

TECHNICAL FIELD OF THE INVENTION

The present invention generally relates to the fabrication of semiconductor integrated circuits, and more particularly relates to phase shift masks using extreme ultraviolet radiation.

BACKGROUND OF THE INVENTION

An optical mask is used to pattern a photoresist layer on a semiconductor substrate. The patterned photoresist layer on the semiconductor substrate forms a mask that is used in conjunction with wafer processing techniques to form devices and interconnect of an integrated circuit. The optical masking process that has dominated wafer processing for the past several decades comprises a quartz substrate patterned with a chrome layer. The optical mask is projection aligned to the semiconductor wafer and is optically reduced, typically in a 4:1 ratio. Radiation of a predetermined wavelength is projected through the mask. The predetermined wavelength is selected such that it passes through the quartz substrate readily. Chromed areas of the mask block the radiation from passing through the mask. The wavelength of radiation used directly relates to the critical dimensions that are achievable by the wafer process. In general, as the wavelength of radiation is reduced in the patterning process a corresponding reduction in the critical dimension can be realized. Thus, transistor and interconnect density have increased in part because of advances in photolithographic techniques in using smaller wavelengths of radiation for wafer patterning.

Radiation of a predetermined wavelength is projected to the optical mask. The radiation is projected to the surface of a semiconductor wafer such that the chromed areas of the mask prevent radiation from impinging on corresponding areas of the surface of the semiconductor wafer. As mentioned previously, the radiation typically impinges on a layer of photoresist that is placed on the surface of the semiconductor substrate. Both positive and negative photoresist have been used in wafer processing. In either case, the photoresist is sensitive to radiation such that areas that are exposed to the radiation are altered. A photoresist development process removes some of the photoresist leaving a patterned mask of photoresist that adheres to the surface of the wafer. Other process steps are then performed on the semiconductor wafer such as etching, doping, and deposition where the underlying areas on the wafer surface having the photoresist are masked or protected from these steps.

The semiconductor industry has had exceptional success in refining the simple chrome masking process to produce smaller geometry devices using smaller wavelengths of radiation but the process cannot be extended indefinitely. A paradigm shift occurs when radiation having wavelength less than approximately 157 nanometers is used in wafer processing. The problem is that radiation having a wavelength below 157 nanometers is readily absorbed by most materials including quartz. Furthermore, the resolution and depth of focus of an optical system become more of an issue at the smaller wavelengths when using a conventional lithographic approach. Ultimately it is the cost and yield of a manufacturing process that determines the suitability of a system for a particular critical dimension.

EUV (extreme ultraviolet) lithography is emerging as a viable solution for sub 0.05 micron critical dimensions. EUV lithography uses short wavelength (approx 13–15 nm) radiation that is reflected to a semiconductor wafer. The EUV mask and the other elements of the EUV lithographic system that transfer radiation to the semiconductor wafer are essentially high quality mirrors. Since EUV radiation is readily absorbed by most materials, the mask substrate should be specially designed with multiple layer pairs of molybdenum and silicon that is highly reflective at the target extreme ultraviolet wavelength. The circuit features patterned on the reflective substrate should be absorbing at EUV wavelength to form an image of the features with high contrast. This is analogous to the chrome masking in an optical mask. Also, diffraction effects are a problem in producing sharp delineation between areas on a semiconductor wafer surface receiving and not receiving EUV light.

Accordingly, it is desirable to provide an extreme ultraviolet lithographic mask that is both manufacturable and capable of producing sub 0.05-micron critical dimensions. In addition, it is desirable to minimize second order effects such as shadowing and sidewall reflection on the EUV mask. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
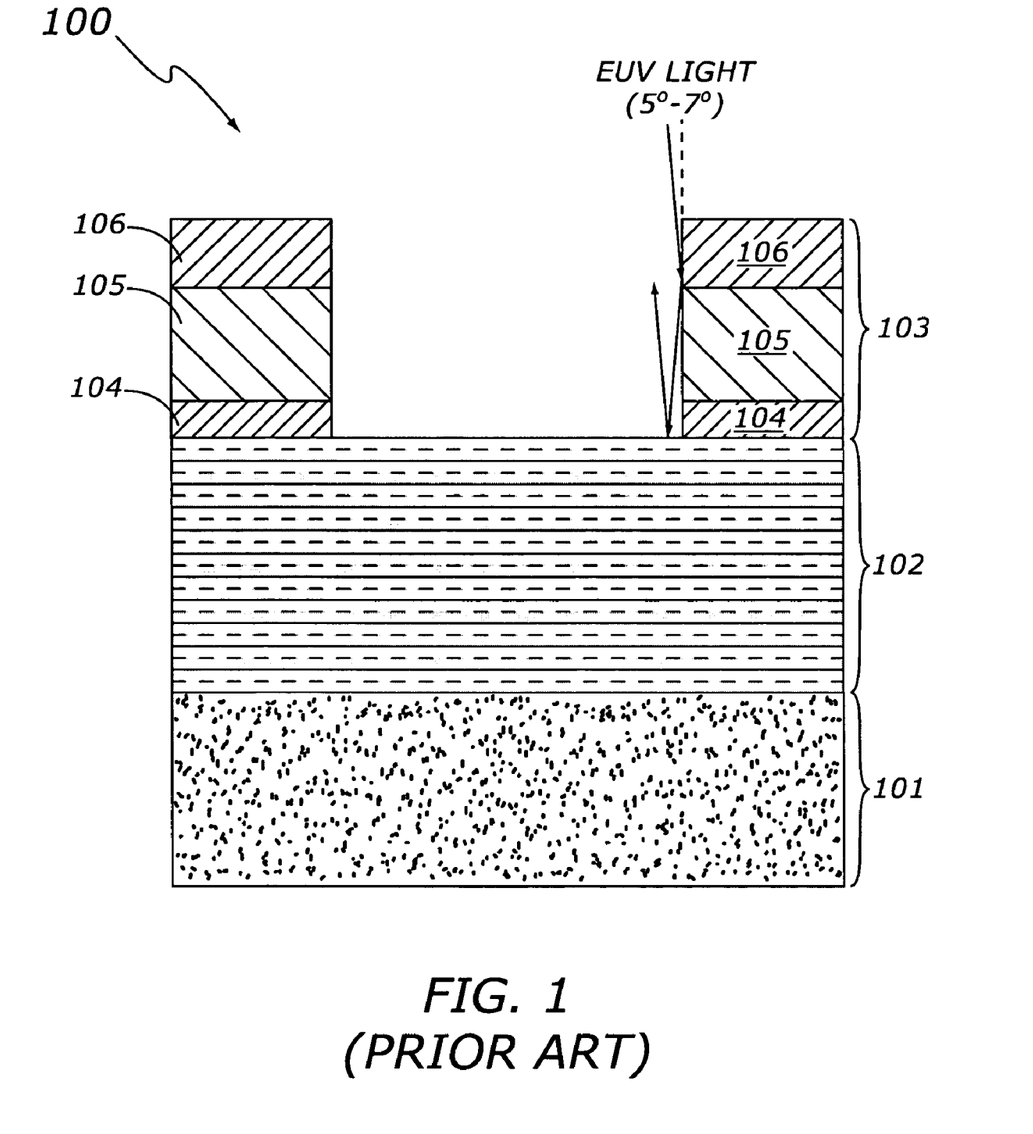
FIG. 1 is an illustration of a prior art phase shift mask for extreme ultraviolet (EUV) lithography.

FIG. 1 is an illustration of a prior art phase shift mask 100 for extreme ultra violet (EUV) lithography. Phase shift mask 100 comprises a substrate 101, a reflectance region 102, and an absorber stack 103. Substrate 101 is a support structure for phase shift mask 100 and is a platform for the layers that comprise the structure. The primary material for substrate 101 is an ultra low thermal expansion material (LTEM). Quartz is not transmissive to extreme ultra violet radiation. EUV radiation does not pass through phase shift mask 100 but is reflected to a semiconductor wafer to expose a layer of photoresist that is deposited on a surface of the semiconductor wafer.

Reflectance region 102 is a structure formed on the surface of substrate 101 to reflect EUV radiation. One embodiment that has been found to perform well for EUV radiation on is an alternating stack of thin films. This is known as a multilayer (ML) reflector. One common multilayer reflector comprises alternating thin films of silicon and molybdenum. Reflectance region 102 is formed using a deposition process. In an embodiment of reflectance region 102, 40 pairs of silicon/molybdenum layers are formed. Each pair of silicon/molybdenum thin films is referred to as a period. A silicon/molybdenum thin film pair is made having a thickness approximately half a wavelength of the EUV source wavelength radiation used on phase shift mask 100 to maximize reflectivity.

Absorber stack 103 is formed on a surface of reflectance region 102. As its name implies, absorber stack 103 prevents the reflection of radiation through absorption. Absorber stack 103 may comprise one or more layers of material that readily absorb the wavelength of radiation used in the lithographic process. Material characterization is important to ensure effective EUV radiation absorption. For example, one embodiment of absorber stack 103 comprises a layer 104 of chrome 104, a layer 105 of TaN, and a layer 106 of SiON. Layers 104–106 are chosen for their material properties, in particular, absorption of EUV radiation and phase shift of EUV radiation. Absorber stack 103 is etched to form a pattern exposing areas of a surface of reflectance region 102. Thus, areas having absorber stack 103 prevent EUV radiation from being reflected (through absorption) while EUV radiation hitting exposed areas of the surface of reflectance region 102 is reflected.

EUV radiation is typically illuminated at a 5–7 degree angle from perpendicular to a surface of reflectance region 102 and absorber stack 103. For a binary EUV mask, EUV radiation impinging on absorber stack 103 is desired to be completely absorbed. However, for attenuated phase shift mask for EUVL this is not the case. The amount of radiation reflection and phase shift from the absorber stack 103 compared to that from the surface of the reflectance region 102 is controlled to provide the desired resolution enhancement. In practice, it has been found that for a phase shift mask 100, it is desirable if the EUV radiation reflected from absorber stack 103 has an intensity in a range of 6–20 percent of the intensity of the EUV radiation reflected from reflectance region 102. In addition, the reflected radiation from absorber stack 103 is desired to be 180 degrees out of phase with the reflected EUV radiation from reflectance region 102 to maximize the contrast of the image formed by the mask through partial destructive interference. The height of absorber stack 103 is another factor in the critical dimensions that can be achieved by phase shift mask 100. The angle at which the EUV radiation is directed at phase shift mask 100 in combination with the height of absorber stack 103 combines to produce results that can be undesirable. One effect is known as a three dimensional shadowing effect that occurs due to absorber stack 103 blocking radiation from fully impinging on or reflecting from the reflectance region 102 in an area adjacent to absorber stack 103. A second effect occurs when EUV radiation hits a sidewall of absorber stack 103 and is reflected to reflectance region 102 producing unwanted reflected EUV radiation. In either case, increasing the height of absorber stack 103 exacerbates both problems.

Manufacturability is an issue with phase shift mask 100. Absorber stack 103 is typically formed from more than one material layer. Since absorber stack 103 is designed to provide both EUV radiation attenuation and phase shift, the main issue in forming the absorber stack 103 is adequate material selection and control of the stack height. In actuality, optimizing the absorber stack 103 for proper attenuation satisfying an exact 180-degree phase shift is not easy for most of the available materials. Even if it satisfies both attenuation and phase shift conditions, the process margin for successful mask fabrication is very narrow, particularly for repair, inspection, and mask cleaning.

Figure 2:
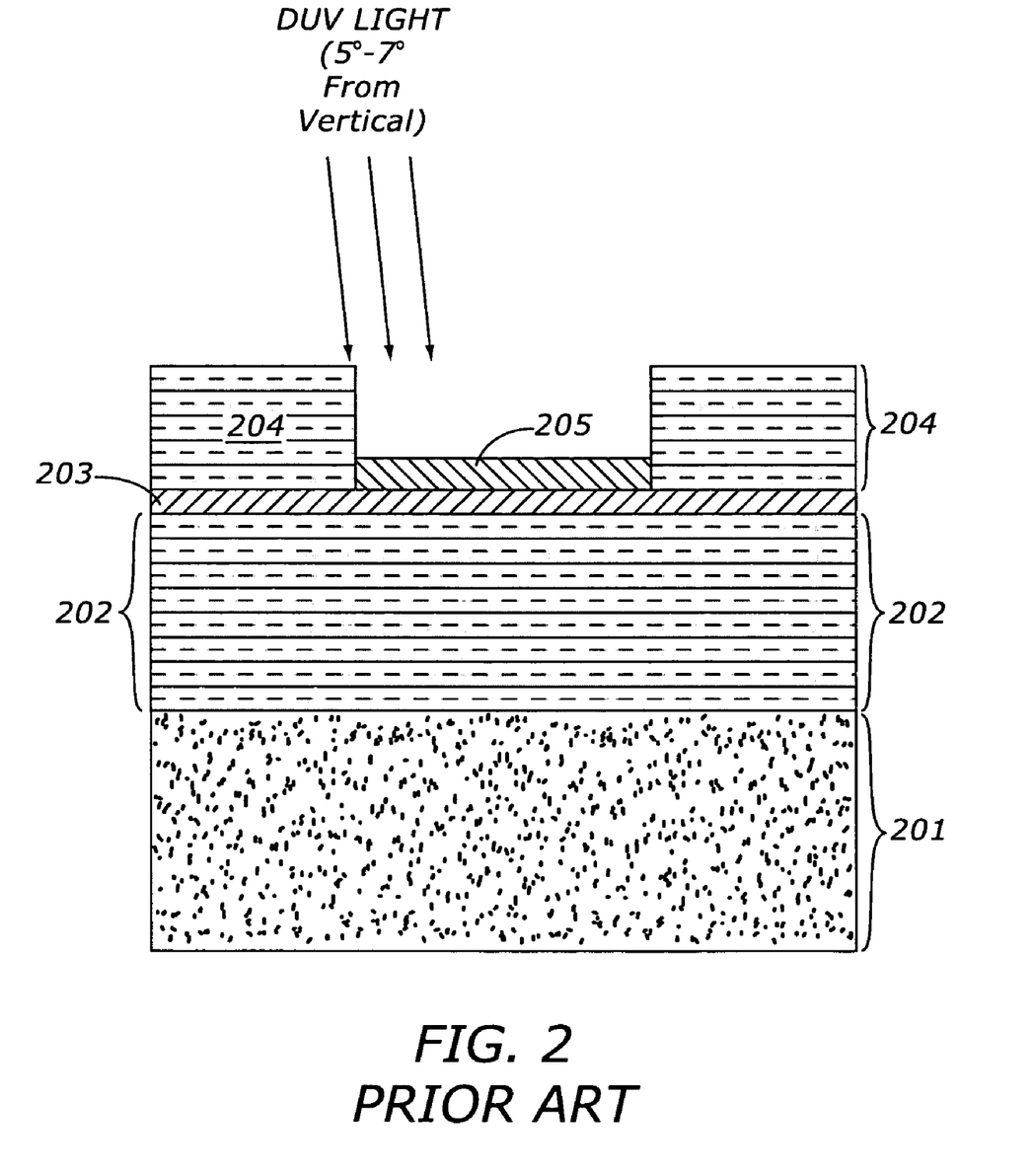
FIG. 2 is an illustration of a prior art phase shift mask for extreme ultraviolet (EUV) lithography.

FIG. 2 is an illustration of a prior art phase shift mask 200 for extreme ultraviolet (EUV) lithography. Phase shift mask 200 comprises a substrate 201, a reflectance region 202, an etch stop layer 203, and a reflectance region 204. In general, phase shift mask 200 eliminates the formation of an attenuation phase shifter on top of a reflectance region. Instead, the attenuation phase shifter is formed in areas etched into phase shift mask 200.

Reflectance region 202 is formed on substrate 201. Reflectance region 202 comprises alternating layers of silicon and molybdenum to form a multilayer thin film reflector. Etch stop layer 203 is formed on reflectance region 202. In one embodiment of phase shift mask 200, etch stop layer 203 is a layer of chromium. Reflectance region 204 is then formed on etch stop layer 203. Similar to reflectance region 202, reflectance region 204 comprises alternating layers of silicon and molybdenum.

The principle behind prior art phase shift mask 200 is to etch portions of reflectance region 204 to create areas on phase shift mask 200 that have relatively reduced reflectivity of EUV radiation. Conversely, the remaining or unetched portions of reflectance region 204 will reflect EUV radiation. Etch stop layer 203 is placed between reflectance regions 202 and 204 as an etch stop at a precise depth. For example, etch stop layer 203 is placed at a depth corresponding to the $26^{th}$ silicon/molybdenum pair for phase shift mask 200 using EUV radiation having a wavelength of 13.4 nanometers. This corresponds to etch stop layer 203 being placed a distance of 1800 Angstroms from a surface of reflectance region 204. The depth of an etched area is selected such that reflected EUV radiation from the etched area is shifted in phase 180 degrees from reflected EUV radiation of an adjacent area of reflectance region 204.

It should be noted that etch stop layer 203 can have a negative impact on radiation impinging on reflectance region 204. Reflected EUV radiation from phase shift mask 200 is a combination of the reflective properties of reflectance region 204, etch stop layer 203, and reflectance region 202. The thickness of etch stop layer 203 is optimized to produce a reflectivity almost at the same level as when there is no embedded etch stop layer between reflectance region 202 and 204 using constructive interference effect of the etch stop layer 203. For example, depositing a 65 angstrom layer of chromium as etch stop layer 203 allows maximum reflectivity of EUV radiation in the reflectance region 204 while performing as an adequate etch stop. Conversely EUV radiation impinging in the etched areas experiences attenuation due to the presence of etch stop layer 203 and fewer ML periods underneath. Greater attenuation is achieved by depositing layer 205 in the etched areas of phase shift mask 200. Layer 205 in combination with etch stop layer 203 attenuate through absorption. For example, depositing 300 angstroms of chrome (layer 205) on the 65 angstrom layer of chromium (etch stop layer 203) achieves attenuation while preserving the desired 180 degrees phase shift. The amount of reflected EUV radiation from an etched area would have an intensity of approximately 7 percent of the intensity of reflected EUV radiation from reflectance region 204.

Phase shift mask 200 provides the benefit of eliminating the formation and subsequent etching of layers on the surface of a multilayer thin film. Also, stray EUV radiation effects such as shadowing and sidewall reflection are reduced because the etched areas are designed for EUV radiation absorption.

Etching is a potential problem with phase shift mask 200. As mentioned previously, the etched areas in reflectance region 204 are etched to a depth of 1800 angstroms which is a substantial etch depth. Although FIG. 2 shows vertical sidewalls, an etching process may not be capable of consistent vertical etching of a multilayer thin film structure such as being currently pursued by the semiconductor industry thereby affecting the critical dimensions that can be achieved using this type of phase shift mask.

Figure 3:
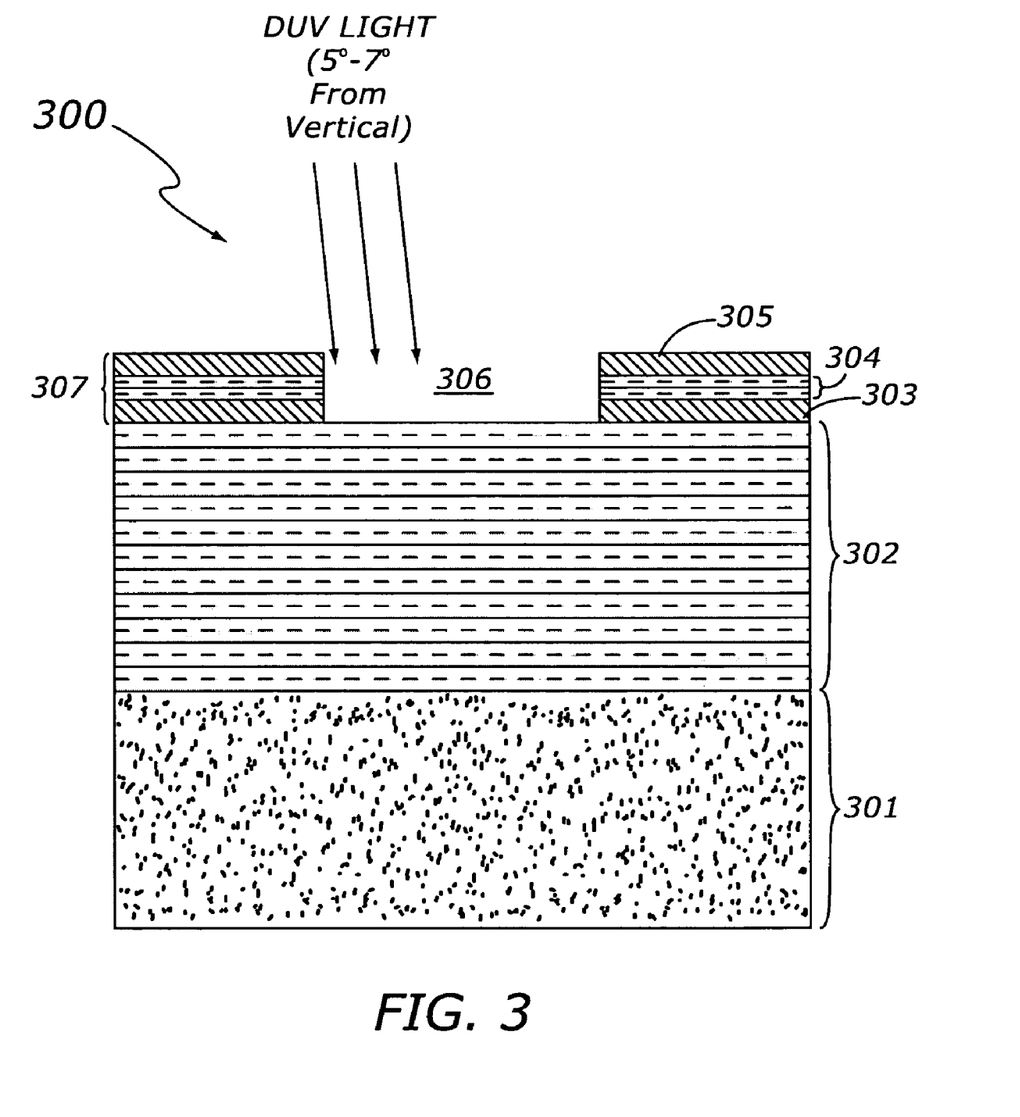
FIG. 3 is a phase shift mask in accordance with the present invention.

FIG. 3 is a phase shift mask 300 in accordance with the present invention. Phase shift mask 300 is used with extreme ultraviolet (EUV) radiation to provide the desired critical dimensions within a manufacturable process window. In general, EUV radiation falls within a range of radiation having a wavelength less than 40 nanometers and more than 1 nanometer. The critical dimensions being targeted for using EUV radiation in semiconductor wafer processing are below 0.05 microns. Phase shift mask 300 comprises a substrate 301, reflectance region 302, and attenuating phase shifter 307. Substrate 301 is a support structure for forming reflectance region 302 and attenuating phase shifter 307. In an embodiment of phase shift mask 300, substrate 301 is formed from low thermal expansion material (LTEM).

EUV radiation is readily absorbed by most materials. EUV radiation directed at phase shift mask 300 produces a pattern that comprises reflected radiation from phase shift mask 300 that is directed to a semiconductor wafer. Typically, the reflected radiation from phase shift mask 300 is reflected off one or more extremely high quality mirrors before reaching a surface of the semiconductor wafer. A layer of photoresist on the semiconductor wafer is exposed by the reflected EUV radiation corresponding to the pattern on phase shift mask 300. A patterned photoresist layer is a result of the EUV radiation exposure that defines areas on the semiconductor wafer to form devices and interconnect of an integrated circuit.

Reflecting radiation from phase shift mask 300 is achieved by reflectance region 302. As mentioned previously, EUV radiation is absorbed by most materials. In an embodiment of reflectance region 302, multilayer (ML) thin films are formed overlying substrate 301. For example, alternating layers of silicon and molybdenum provide reasonable reflection of EUV radiation. The alternating layers of materials have different EUV optical constants that provide resonant reflectivity when a period is approximately half of the wavelength of the EUV radiation being used. A period is the combined thickness of a layer pair having different EUV optical constants such as silicon and molybdenum. In an embodiment using EUV radiation having a wavelength of 13.4 nanometers, the period of silicon/molybdenum thin film pair is approximately 69 angstroms thick. A substantial number of periods are required for optimum reflectivity. In general, the number of periods is a balance between maximizing reflectivity and the cost and complexity of mask manufacture. For example, 40 periods (69 angstroms each) of silicon/molybdenum thin film pairs produces a reflectivity of 60–70 percent of the received 13.4 nanometer wavelength EUV radiation impinging on reflectance region 302. Increasing the number of periods greater than 40 provides limited benefit in increasing reflectivity while greatly increasing the cost of manufacturing. The material used to form reflectance region 302 will evolve in the future as different materials, and combinations of materials are identified and tested. Thus, although silicon/molybdenum pairs are called out for embodiments of reflectance regions it is within the scope of this invention to use other material types for EUV radiation reflection as well as the anticipation of new reflector material.

Attenuating phase shifter 307 overlies reflectance region 302. Attenuating phase shifter 307 includes more than one aperture or opening 306. A single opening 306 is shown to simplify the description of phase shift mask 300. Attenuating phase shifter 307 is patterned having apertures or openings in areas where radiation is to be reflected from phase shift mask 300 to a semiconductor wafer. An aperture or opening in attenuating phase shifter 307 exposes a surface of reflectance region 302. Similar to FIGS. 1 and 2, EUV radiation is typically provided to phase shift mask 300 at a 5–7 degree angle from vertical to a surface of reflectance region 302. In general, EUV radiation impinging on attenuating phase shifter 307 produces reflected radiation that is attenuated and shifted in phase. More specifically, attenuating phase shifter 307 utilizes destructive interference along with absorption to attenuate EUV radiation. Using destructive interference allows a substantial reduction in height of attenuating phase shifter 307 thereby reducing shadowing and stray radiation effects as described hereinabove and also produces a manufacturable structure that greatly reduces the depth of etching required when compared to prior art phase shift masks. In general, the height of attenuating phase shifter 307 is less than 700 angstroms.

EUV radiation impinging on attenuating phase shifter 307 is not only attenuated but also shifted in phase. The reason for attenuation and 180 degree phase shifting in the region 307 is to enhance the image contrast through partially destructive interference. Without 180 degree phase shift between the two regions 307 and 306, diffraction contributes to a loss of image contrast which increases the critical dimension that can be achieved with a reasonable process margin. In other words, image contrast is maximized by producing reflected radiation from attenuating phase shifter 307 that is 180 degrees out of phase from EUV radiation reflected from reflectance region 302.

In one embodiment, attenuating phase shifter 307 comprises a layer 303, a reflectance region 304, and a layer 305. Layer 303 is a thin material layer overlying reflectance region 302 and has a predetermined thickness for producing optimal destructive interference for a specific wavelength of EUV radiation. In an embodiment of phase shift mask 300, layer 303 comprises a 27 angstrom NiFe thin film for providing destructive interference of EUV radiation having a wavelength of 13.4 nanometers. Other materials having similar properties such as HfO, ZrO, and ITO could be used in place of NiFe. It should be noted that layer 303 provides substantial benefit in reducing a combined stack height of layer 303, reflectance region 304, and layer 305 because attenuation occurs in layer 303 mostly through destructive interference and partly through absorption. Using a thin film in an application such as described in FIGS. 1 and 2 where attenuation is achieved through only absorption would require a substantially thicker layer. Reflectance region 304 and layer 305 provide both attenuation and phase shift in a manner that further reduces the height of the stack comprising attenuating phase shifter 307. Reflectance region 304 overlies layer 303. Layer 305 overlies reflectance region 304. In an embodiment of phase shift mask 300, reflectance region 304 is a silicon/molybdenum multilayer structure having a period of 69 angstroms for use with 13.4 nanometer wavelength EUV radiation. Reflectance region 304 is made equivalent to reflectance region 302 to simplify manufacturability and ensure interference by the embedded layer 303. Layer 305 is a TaN thin film that absorbs EUV radiation. This example is for illustrative purposes. It should be known to one skilled in the art that other material or material combinations can be substituted in phase shift mask 300 to provide partial destructive interference, absorption, and phase shift and the invention is not limited to the described example. For example, the layer 305 can function as an antireflection coating (ARC) layer for the inspection purposes as well as an attenuating layer. Other materials having similar properties such as TaSiN, Cr, SiC, and ITO could also be used for layer 305.

Figure 4:
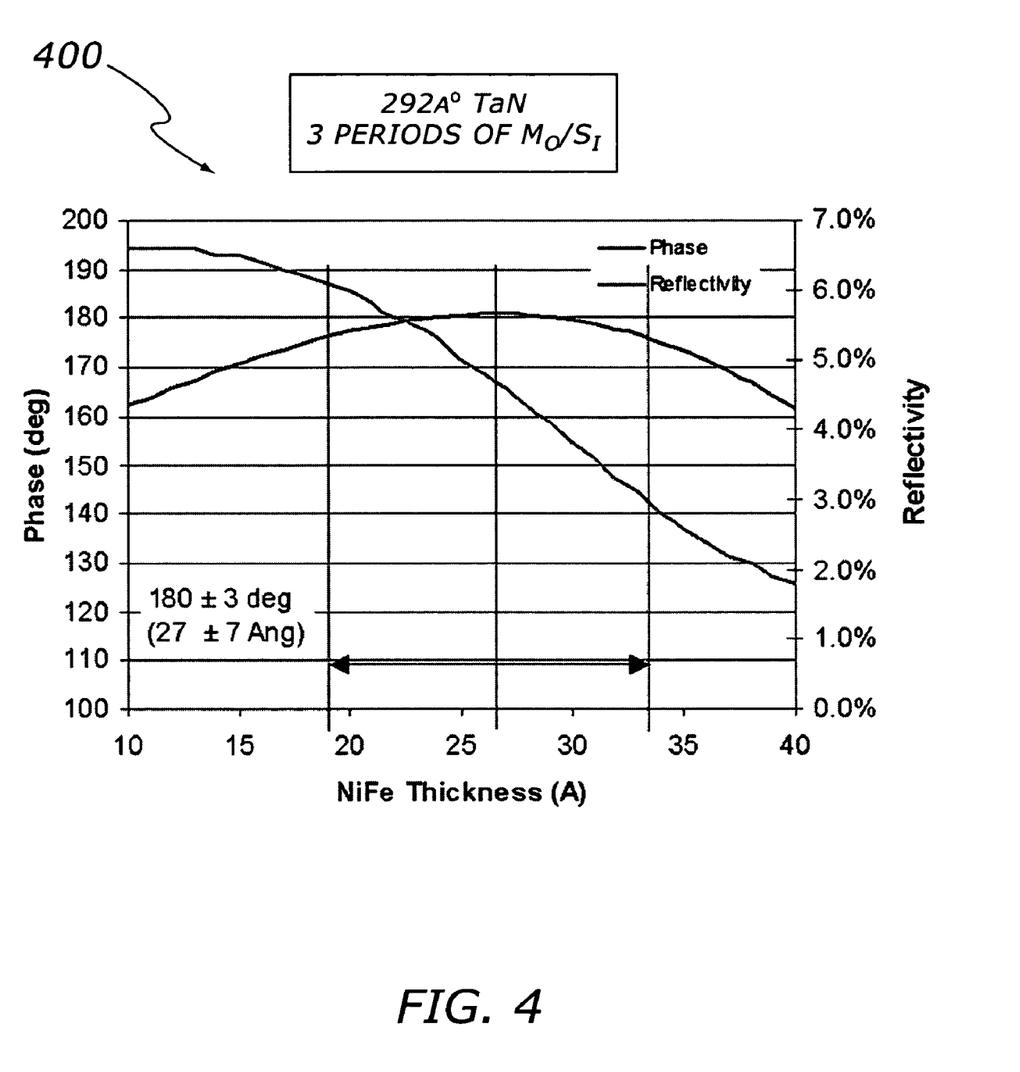
FIG. 4 is a phase shift and reflectivity graph of a first exemplary embodiment of the phase shift mask of FIG. 3 in accordance with the present invention.

FIG. 4 is a phase shift and reflectivity graph 400 of a first exemplary embodiment of phase shift mask 300 of FIG. 3 in accordance with the present invention. Graph 400 shows two parameters, reflectivity and phase shift as a function of the thickness of layer 303 of FIG. 3. In the embodiment, layer 303 is a thin film layer comprising NiFe that provides both partial destructive interference and absorption of 13.4 nanometer wavelength EUV radiation. The center point from a processing perspective of the NiFe thin film layer is 27 angstroms thick. The center point coincides where the optimum 180 degrees of phase shift occurs. In this embodiment, layer 304 of FIG. 3 comprises 3 periods of silicon/molybdenum multilayers having a period thickness of 69 angstroms. Layer 305 of FIG. 3 comprises a TaN thin film 292 angstroms thick. The total stack height of layers 303, reflectance region 304, and layer 305 is approximately 526 angstroms. Note that the thickness is substantially less than the 1800 angstroms that must be etched into reflectance region 204 of FIG. 2. Problems with etching phase shift mask 300 of FIG. 3 are greatly reduced thereby simplifying manufacture and decreasing the critical dimensions that can be achieved. Reflectance region 302 is optimized for EUV radiation reflectivity and comprises approximately 40 pairs of alternating thin films of silicon and molybdenum.

As shown in graph 400, EUV radiation impinging on and reflecting from layer 303, reflectance region 304, and layer 305 is shifted 180 degrees out of phase in relation to reflected EUV radiation from reflectance region 302 of FIG. 3 when the NiFe layer is 27 angstroms thick. Thus, image contrast is maximized for features with critical dimensions. The process latitude is robust whereby a positive or negative variation of 5 angstroms in meeting the 27 angstrom NiFe thin film thickness results in a three degree change in phase shift. Within this same process variation range for NiFe thickness, normalized reflectivity in relation to reflected radiation from reflectance region 302 is approximately 5 percent.

Figure 5:
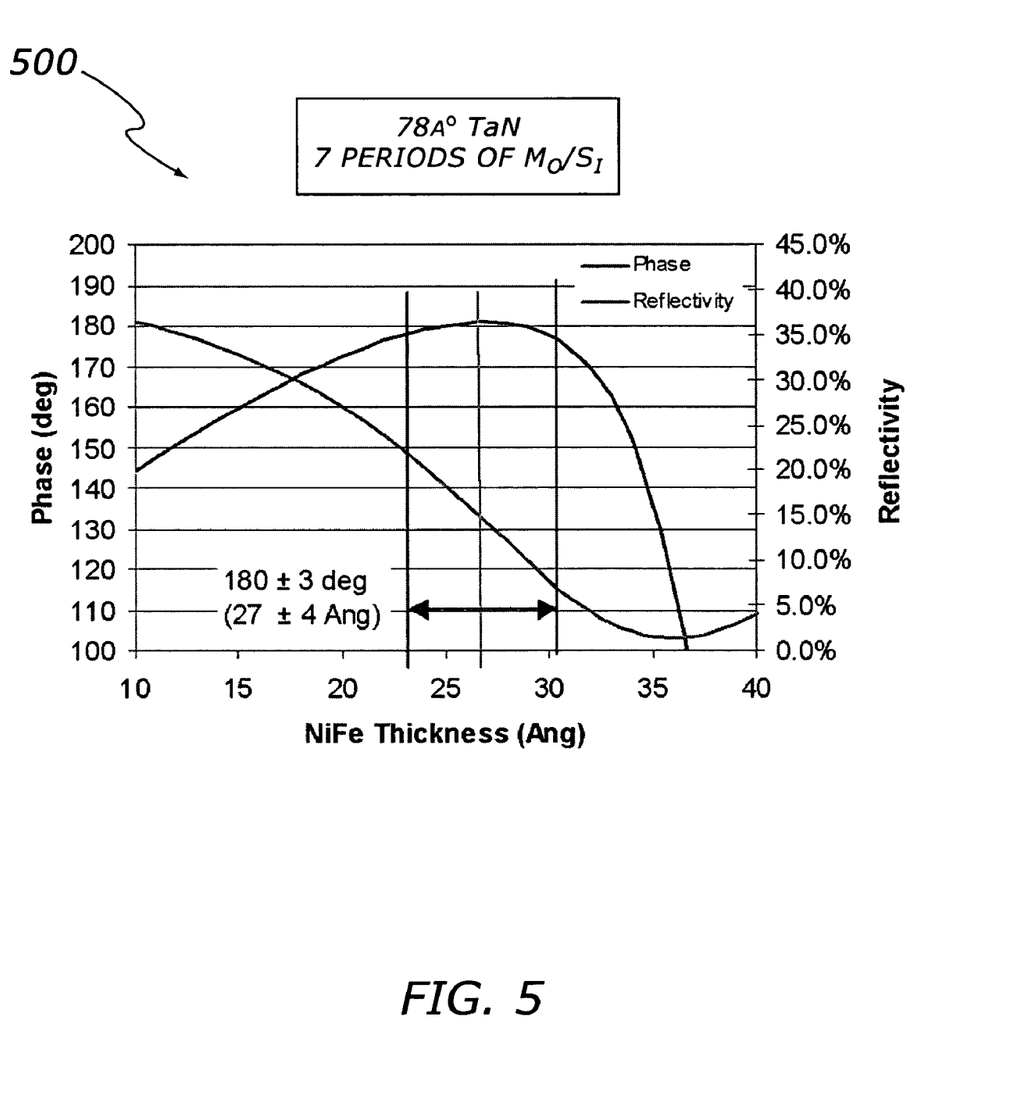
FIG. 5 is a phase shift and reflectivity graph of a second exemplary embodiment of the phase shift mask of FIG. 3 in accordance with the present invention.

FIG. 5 is a phase shift and reflectivity graph 500 of a second exemplary embodiment of phase shift mask 300 of FIG. 3 in accordance with the present invention. Similar to the embodiment described in FIG. 4, layer 303 of FIG. 3 is a thin film layer comprising NiFe that is deposited having a thickness of 27 angstroms. The NiFe thin film layer provides both partial destructive interference and partial absorption of 13.4 nanometer wavelength EUV radiation as mentioned previously. Phase shift mask 300 is designed such that EUV radiation impinging on and reflecting from layer 303, reflectance region 304, and layer 305 is shifted 180 degrees out of phase in relation to reflected EUV radiation from reflectance region 302 of FIG. 3 when the NiFe layer is 27 angstroms thick.

The embodiment described in the graph of FIG. 4 has three periods of a silicon/molybdenum thin film multilayer and a 292 angstrom TaN layer. In the embodiment of FIG. 5, reflectance region 304 of FIG. 3 is increased to seven periods of a silicon/molybdenum thin film multilayer while layer 305 of FIG. 3 is reduced to 78 angstroms of TaN. The combined stack height of layer 303, reflectance region 304, and layer 305 is approximately 588 angstroms which is thicker than the stack height described in FIG. 4 but greatly reduced when compared to prior art EUV masks. This exemplary embodiment illustrates the flexibility of mask design that the thickness of topmost surface layer 305 can be arbitrarily controlled to satisfy the ARC function during the mask inspection.

The phase shift curve is more severely sloped around the 27 angstrom NiFe thickness center point which increases the sensitivity to process variation when compared to the phase shift curve of FIG. 4. Still, a positive or negative variation of less than 4 angstroms in NiFe thickness results in only 3 degrees of variation in phase shift from the 180 degree ideal. Similarly, the reflectivity curve shows a much greater variation when compared to the reflectivity curve in FIG. 4. Reflectivity is approximately 15% for the thickness of 27 angstrom of NiFe embedded layer radiation. Part of the decreased attenuation is due to the decreased thickness of the TaN layer which is better at attenuating EUV radiation than the silicon/molybdenum thin film multilayers. Although the performance indicated in FIG. 5 is not as good as that shown in FIG. 4, it does point out that there are a multitude of different potential combinations of material thicknesses and material types that can be used. Also, both examples shown in FIG. 4 and FIG. 5 have greatly reduced stack heights due to the configuration of phase shift mask 300 and the use of destructive interference to contribute to EUV radiation attenuation.

Figure 6:
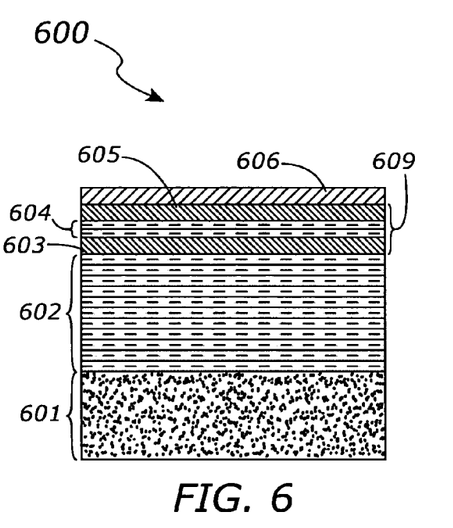
FIG. 6 is an illustration of a phase shift mask before etching in accordance with the present invention.

FIGS. 6–9 describe processing steps to form a phase shift mask 600 in accordance with the present invention. FIG. 6 is an illustration of a phase shift mask 600 before etching in accordance with the present invention. Phase shift mask 600 comprises a substrate 601, reflectance region 602, and an attenuating phase shifter 609. Attenuating phase shifter 609 comprises an embedded layer 603, a reflectance region 604, and an absorber layer 605. Substrate 601 is support structure for phase shift mask 600. In an embodiment of phase shift mask 600, substrate 601 is formed from material with low thermal expansion coefficient such as fused silica doped with titanium oxide.

Reflectance region 602 is designed to efficiently reflect EUV radiation. Reflectance region 602 overlies substrate 601. In an embodiment of phase shift mask 600, reflectance region 602 comprises alternating layers of silicon and molybdenum. Reflectance region 602 is formed by depositing alternating layers of silicon and molybdenum such that a silicon/molybdenum layer pair has a thickness of approximately half a wavelength of the EUV radiation to be reflected. Usually a large number of periods are required (ex. 40 periods) to ensure high reflectivity of EUV radiation which is readily absorbed by most materials.

Embedded layer 603 overlies reflectance region 602. Embedded layer 603 acts as an etch stop as will be shown in later process steps. Embedded layer 603 is designed for destructive interference and absorption of EUV radiation for increased attenuation. In an embodiment of phase shift mask 600, embedded layer 603 is formed of NiFe. The NiFe is deposited on reflectance region 602 at a predetermined thickness.

Reflectance region 604 is provided for attenuation and phase shift. Reflectance region 604 overlies embedded layer 603. In an embodiment of phase shift mask 600, reflectance region 604 comprises alternating layers of silicon and molybdenum equivalent to reflectance region 602. One reason for using silicon/molybdenum is the fact that the processing steps to form reflectance region 604 are already established thereby simplifying manufacture. Another reason for using Silicon/Molybdenum for the region 604 is that the interference due to the presence of the embedded layer 603 is more effective when the layer 603 is sandwiched by same kind of alternating pair materials. Thus, similar to reflectance region 602, reflectance region 604 is preferably formed by depositing alternating layers of silicon and molybdenum on embedded layer 603.

Absorber layer 605 also provides attenuation and phase shift to phase shift mask 600. Absorber layer 605 overlies reflectance region 604. In an embodiment of phase shift mask 600, layer 605 comprises a thin film of TaN. The TaN thin film is deposited on reflectance region 604. Embedded layer 603, reflectance region 604 and absorber layer 605 works in concert to provide attenuation and phase shift. More specifically, reflectance region 604 and absorber layer 605 provide additional phase shift in conjunction with embedded layer 603 such that radiation reflected from embedded layer 603, reflectance region 604, and absorber layer 605 is 180 degrees out of phase with radiation reflected from reflectance region 602 thereby achieving better resolution in circuit printing. A hard mask 606 is deposited on absorber layer 605 and acts as a protective layer to subsequent steps of the mask generation process.

Figure 7:
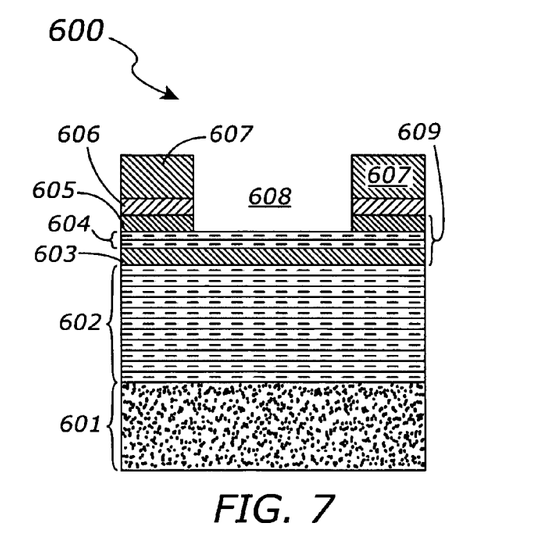
FIG. 7 is an illustration of an etch step that exposes a reflectance region in accordance with the present invention.

FIG. 7 is an illustration of an etch step that exposes reflectance region 604 in accordance with the present invention. A single aperture or opening 608 is shown for simplification of the diagram. In reality, a phase shift mask surface will have a large number of openings formed in the attenuating phase shifter 609 of phase shift mask 600. A photoresist layer 607 is formed on hard mask 606. Photoresist layer 607 is patterned and etched such that an opening 608 is formed through photoresist layer 607 exposing hard mask 606. An etching process or material removal process is then applied to phase shift mask 600 to remove hard mask 606 and absorber layer 605 in opening 608. Removing hard mask 606 and absorber layer 605 is achieved in a single step or multiple material removal steps. Phase shift mask 600 is protected from being etched in areas having photoresist layer 607. Reflectance region 604 is now exposed in opening 608.

Figure 8:
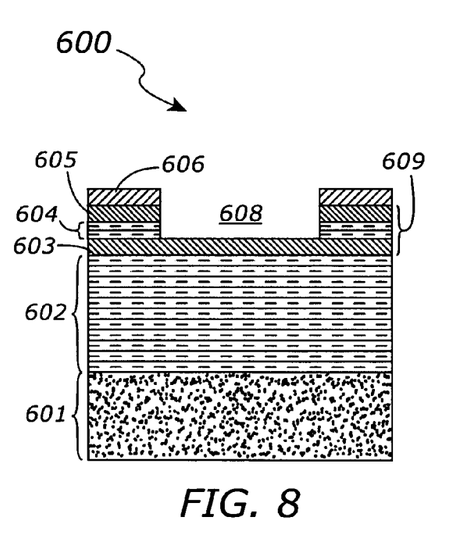
FIG. 8 is an illustration of an etch step that exposes an embedded layer in accordance with the present invention.

FIG. 8 is an illustration of an etch step that exposes embedded layer 603 in accordance with the present invention. Reflectance region 604 is exposed in opening 608 by the process steps described in FIG. 7. An etch step or material removal process is then applied to phase shift mask 600 to remove reflectance region 604 exposed in opening 608. Removing reflectance region 604 in opening 608 exposes embedded layer 603. Photoresist layer 607 is removed exposing hard mask layer 606 underlying photoresist layer 607.

Figure 9:
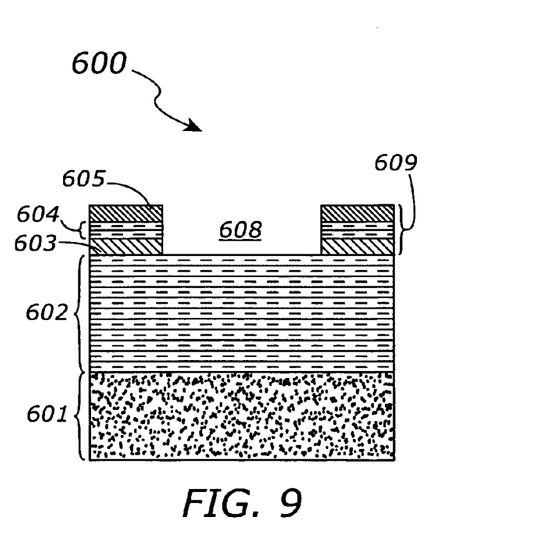
FIG. 9 is an illustration of an etch step that exposes a reflectance region in accordance with the present invention.

FIG. 9 is an illustration of an etch step that exposes reflectance region 602 in accordance with the present invention. Embedded layer 603 is exposed in opening 608 by the process steps described in FIG. 8. An etch step or material removal process is then applied to phase shift mask 600 to remove embedded layer 603 exposed in opening 608. Removing embedded layer 603 in opening 608 exposes reflectance region 602. Hard mask 606 is then removed exposing the underlying absorber layer 605. Thus, EUV radiation directed at phase shift mask 600 will be reflected from areas of reflectance region 602 exposed by this process. Conversely, EUV radiation directed at phase shift mask 600 on areas where absorber layer 605 is exposed will be attenuated and shifted in phase.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. An extreme ultraviolet (EUV) lithographic mask comprising:
   a substrate;
   a first reflectance region overlying said substrate; and
   an attenuating phase shifter overlying said first reflectance region and comprised of a first layer, and a second layer having a second reflectance region formed therebetween, the first layer having a thickness selected to alter the phase relationship between the first reflectance region and the second reflectance region resulting in destructive interference between a reflection from the first reflectance region and a reflection from the second reflectance region, wherein a plurality of openings through said attenuating phase shifter expose portions of said first reflectance region and wherein said attenuating phase shifter attenuates EUV radiation through a combination of absorption and destructive interference.

2. The extreme ultraviolet (EUV) lithographic mask as recited in claim 1 wherein said attenuating phase shifter comprises:
   an embedded layer overlying said first reflectance region;
   a second reflectance region overlying said embedded layer; and
   an absorber layer overlying said embedded layer.

3. The extreme ultraviolet (EUV) lithographic mask as recited in claim 2 wherein said embedded layer is an etch stop for etching said plurality of openings through said attenuating phase shifter.

4. The extreme ultraviolet (EUV) lithographic mask as recited in claim 3 wherein said embedded layer is optically tuned for destructive interference to attenuate EUV thereby minimizing a stack height of said embedded layer, said second reflectance region, and said absorber layer.

5. The extreme ultraviolet (EUV) lithographic mask as recited in claim 4 wherein said first and second reflectance regions comprise multilayer thin films for reflecting EUV radiation.

6. The extreme ultraviolet (EUV) lithographic mask as recited in claim 5 wherein said first and second reflectance regions comprise alternating thin film layers of molybdenum and silicon.

7. The extreme ultraviolet (EUV) lithographic mask as recited in claim 6 wherein a period of said first and second reflectance region has a thickness approximately equal to a half of the wavelength of EUV radiation that is directed at the EUV lithographic mask for patterning a semiconductor substrate.

8. The extreme ultraviolet (EUV) lithographic mask as recited in claim 4 wherein said embedded layer comprises NiFe.

9. The extreme ultraviolet (EUV) lithographic mask as recited in claim 4 wherein said absorber layer comprises TaN.

10. The extreme ultraviolet (EUV) lithographic mask as recited in claim 4 wherein said substrate comprises LTEM (low thermal expansion material).

11. The extreme ultraviolet (EUV) lithographic mask as recited in claim 4 wherein a total stack height of said embedded layer, said second reflectance region, and said absorber layer is less than 700 angstroms.

12. The extreme ultraviolet (EUV) lithographic mask as recited in claim 11 wherein EUV radiation reflected from said embedded layer, said second reflectance region, and said absorber layer is phase shifted approximately 180 degrees out of phase to EUV radiation reflected from said first reflectance region.

13. The extreme ultraviolet (EUV) lithographic mask as recited in claim 12 wherein said embedded layer comprises a layer of NiFe approximately 27 angstroms thick.

14. The extreme ultraviolet (EUV) lithographic mask as recited in claim 13 wherein said absorber layer comprises approximately 292 angstroms of TaN and wherein said second reflectance region comprises 7 periods of molybdenum and silicon.

15. A method of manufacturing an integrated circuit comprising the steps of:
projecting radiation having a wavelength less than 40 nanometers towards a mask having a plurality of openings through an attenuating phase shifter, said plurality of openings expose a reflectance region in said mask wherein said attenuating phase shifter is less than 700 angstroms thick;
reflecting radiation impinging on said reflectance region exposed by said plurality of openings; and
attenuating and phase shifting radiation impinging on said attenuating phase shifter wherein said attenuating phase shifter attenuates radiation through destructive interference and absorption, said attenuating phase shifter overlying said first reflectance region and comprised of a first layer, and a second layer having a second reflectance region formed therebetween, the first layer having a thickness selected to alter the phase relationship between the first reflectance region and the second reflectance region resulting in destructive interference between a reflection from the first reflectance region and a reflection from the second reflectance region.

16. The method of manufacturing an integrated circuit as recited in claim 15 further including a step of directing radiation reflected from said mask to a semiconductor wafer.

17. The method of manufacturing an integrated circuit as recited in claim 16 wherein said step of attenuating and phase shifting radiation impinging on said attenuating phase shifter wherein said attenuating phase shifter attenuates radiation through destructive interference and absorption further includes a step of using an approximately 27 angstrom layer of NIFe in said attenuating phase shifter to destructively interfere with radiation impinging thereon.

18. The method of manufacturing an integrated circuit as recited in claim 16 further including the steps of:
exposing photoresist on a surface of said semiconductor wafer with radiation reflected from said mask;
removing some of said photoresist corresponding to photoresist exposed by radiation reflected from said mask to form a pattern of photoresist on said surface of said semiconductor wafer; and
using said pattern of photoresist to form devices and interconnect of the integrated circuit.

19. The method of manufacturing an integrated circuit as recited in claim 15 wherein said step of attenuating and phase shifting radiation impinging on said attenuating phase shifter wherein said attenuating phase shifter attenuates radiation through destructive interference and absorption further includes a step of providing an attenuating phase shifter comprising an embedded layer, a second reflectance region, and an absorber layer.

20. The method of manufacturing an integrated circuit as recited in claim 19 further including a step of using said embedded layer as an etch stop for etching said plurality of openings through said attenuating phase shifter.

21. The method of manufacturing an integrated circuit as recited in claim 19 further including a step of using a multilayer thin film for said second reflectance region.

22. The method of manufacturing an integrated circuit as recited in claim 19 using alternating layers of molybdenum and silicon in said second reflectance region.

23. The method of manufacturing an integrated circuit as recited in claim 19 using a period in said reflectance region and said second reflectance region substantially equal to a half of the wavelength of the projected EUV radiation.

24. The method of manufacturing an integrated circuit as recited in claim 19 further including the step of shifting EUV radiation reflected from said attenuating phase shifter 180 degrees out of phase with EUV radiation reflected from said reflectance region.

25. The method of manufacturing an integrated circuit as recited in claim 15 further including a step of supporting said reflectance region and said attenuating phase shifter with a low thermal expansion substrate.

26. The method of manufacturing an integrated circuit as recited in claim 19 further including a step of using 7 periods of molybdenum and silicon as said second reflectance region.

27. The method of manufacturing an integrated circuit as recited in claim 19 further including the step of using a layer of TaN approximately 292 angstroms thick as said absorber layer.

28. A method of forming an extreme ultraviolet (EUV) mask for reflecting radiation having a wavelength less than 40 nanometers comprising the steps of:
providing a substrate;
forming a first reflectance region overlying said substrate;
forming an attenuating phase shifter overlying said first reflectance region wherein said attenuating phase shifter attenuates EUV radiation through a combination of destructive interference and absorption and wherein said attenuating phase shifter is less than 700 angstroms thick, said attenuating phase shifter comprised of a first layer, and a second layer having a second reflectance region formed therebetween, the first layer having a thickness selected to alter the phase relationship between the first reflectance region and the second reflectance region resulting in destructive interference between a reflection from the first reflectance region and a reflection from the second reflectance region; and forming a plurality of openings through said attenuating phase shifter to expose said first reflectance region.

29. The method of forming an extreme ultraviolet (EUV) mask as recited in claim 28 wherein said step of forming an attenuating phase shifter overlying said first reflectance region wherein said attenuating phase shifter attenuates EUV radiation through a combination of destructive interference and absorption and wherein said attenuating phase shifter is less than 700 angstroms thick further includes the steps of:

forming an embedded layer overlying said first reflectance region, said embedded layer being tuned to destructively interfere with EUV radiation;

forming a second reflectance region overlying said embedded layer; and forming an absorber layer overlying said second reflectance region wherein said embedded layer acts as an etch stop when forming said plurality of openings.

* * * * *